United States Patent [19]

Burns

[11] Patent Number: 5,448,179

[45] Date of Patent: Sep. 5, 1995

[54] SCREENING OF CONDUCTORS AND CONTACTS ON MICROELECTRONIC DEVICES

[75] Inventor: Daniel J. Burns, Rome, N.Y.

[73] Assignee: The United States of America as represented by the Secretary of the Air Force, Washington, D.C.

[21] Appl. No.: 278,534

[22] Filed: Jul. 12, 1994

[51] Int. Cl.⁶ .............................................. G01R 31/26
[52] U.S. Cl. .................................. 324/765; 324/537; 437/8; 257/48
[58] Field of Search ............ 324/537, 754, 765, 158.1; 437/8; 257/48

[56] References Cited

U.S. PATENT DOCUMENTS

| | | | |
|---|---|---|---|
| 3,788,911 | 1/1974 | Unger | 324/537 |
| 4,760,032 | 7/1988 | Turner | 437/8 |
| 4,884,122 | 11/1989 | Eichelberger et al. | 257/48 |
| 5,047,711 | 9/1991 | Smith et al. | 324/158 R |
| 5,130,644 | 7/1992 | Ott | 324/158 F |
| 5,241,266 | 8/1993 | Ahmad et al. | 324/765 |
| 5,279,975 | 1/1994 | Devereaux et al. | 437/8 |
| 5,307,010 | 4/1994 | Chiu | 324/765 |

*Primary Examiner*—Kenneth A. Wieder
*Assistant Examiner*—Glenn W. Brown
*Attorney, Agent, or Firm*—William G. Auton; Jacob N. Erlich

[57] ABSTRACT

A method is disclosed for testing or screening metal or polysilicon conductors and contacts on microelectronic devices that it uses a modified design layout for individual logic gates to enable high current density testing of all such elements used in the final functional circuit. The method uses a special metal pattern adding metal conductor paths to enable high current testing of normal conductors and contacts at an intermediate point during fabrication. The metal layer is patterned a second time to remove the high current paths and enable functional operation. This allows burn-in and screen testing to be performed at higher current densities than would otherwise be possible.

8 Claims, 3 Drawing Sheets inv
25 x 54

SCREENING OF CONDUCTORS AND CONTACTS ON MICROELECTRONIC DEVICES

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductors, and more specifically the invention pertains to a means of testing ohmic contacts on microelectronics.

Metallization films commonly used for interconnecting components on microelectronic devices are subject to a variety of defect and wearout related failure mechanisms. These mechanisms can give misleading results during burn-in testing of semiconductors. Burn-in testing is part of a normal fabrication process and it entails the operation of a device at a higher than normal temperature, voltage level or normal frequency of operation to test for circuit failures. Unfortunately, burn-in testing can be misleading in that defective metal conductors may not fail in the limited burn-in time, and it is not possible to accelerate the failure by increasing current density through the defect. For example, deposition process and patterning problems, as well as foreign particles, may result in areas of extra or missing metal, or reduced film thickness so that the metal contact may fail in a year at normal use conditions, but will not fail in burn-in. Also, metallization microstructure and thermal or mechanical stress and stress gradients in overcoat insulator and metal films may influence or drive mass transport failure mechanisms. Metal atom vacancy diffusion flux divergences may occur at grain boundary triple points, and this is thought to cause observed mass transport, or electromigration, of metal from certain areas to others. These failure mechanisms generally work to shorten the life-time of the conductors in which they occur by causing and/or growing voids or metal protrusions. Voids may reduce the stripe cross-sectional area, increase the current density in it, and in turn cause increased resistance, timing faults, or open circuits. Protrusions may cause shorts between normally isolated stripes.

Ideally, none of the failure mechanisms described above would be present in a particular integrated circuit manufactured with well controlled materials, processes, design rules, and in-use current densities. Ideally, all circuits would be manufactured with predictable lifetime characteristics. In reality, it is very difficult to assure that this is the case, and there is much evidence that these failure mechanisms are not completely understood, modeled, and controlled. Further, there is evidence that there may be synergy among some of these failure mechanisms. Under some conditions the presence or action of one failure mechanism may alter the rate of another. For example, a slit void may grow laterally due to electromigration from the side of a stress relief notch void, causing mechanical stress gradient changes and electrical resistance changes, all the while being influenced by thermal gradients established by current flow in and heat sinking of the stripe. It may be difficult to determine the reliability of a particular part since it may depend on its weak link, which may in turn depend on a number of factors such as photolith flaws, residual built-in mechanical stress, grain boundary orientation, thermal history, and the distribution of stripe lengths in the part. These complexities make metal film reliability modeling, prediction, and assurance difficult and questionable on a part-by-part basis.

The task of testing semiconductors accurately without having a failure in ohmic contacts is alleviated, to some extent, by the systems disclosed in the following U.S. Patents, the disclosures of which are incorporated herein by reference:

U.S. Pat. No. 5,130,644 issued to Ott;
U.S. Pat. No. 5,047,711 issued to Smith et al; and
U.S. Pat. No. 4,760,032 issued to Turner.

The patent to Turner discloses the patterning of an aluminum layer for testing insulating oxide films and the removal of the aluminum layer after testing. The Turner aluminum layer does not allow for high current path testing, and doesn't acknowledge that traditional burn-in testing can be enhanced to screen conductors and contacts. The remaining patents are of interest for other testing approaches.

Several approaches are used in the present art to assure metal film reliability. Process controls, particle and defect reduction measures, and current density design rules attempt to eliminate or control the root causes of the failure mechanisms. Wafer level acceptance tests or fast reliability tests may be used to monitor process outcomes by using special test structures and fast tests. These may measure some parameter related to expected lifetime, and are usually done at very high stress conditions compared to those experienced during use. Scanning electron microscope inspections may be used to inspect step coverage, and void sizes and densities. Functional testing and burn-in of finished parts may be used to weed out those containing failed conductors. However, since these failure mechanisms depend on the local micro structure, tests done on material other than the finished part itself may or may not predict the condition and behavior of the finished part. This is especially true where the failure mechanism is influenced by some factor which is located randomly, or in a manner which cannot be strictly controlled, such as grain boundary size and orientation, or particle deposition.

There are no tests or screens available in the present art which allow evaluation of all of the patterned conductors and contacts in an individual part after deposition, except for functional testing, which uses low current densities limited by the saturated drain currents of transistors, and short periods of time. Functional testing may not cause failure or detection of unreliable conductors, and 100% inspection is not practical now.

SUMMARY OF THE INVENTION

The present invention provides an improved method for testing or screening metal or polysilicon conductors and contacts on microelectronic devices. It uses a modified design layout for individual logic gates to enable high current density testing of all such elements used in the final functional circuit. The method uses a special metal pattern and other features to enable testing at an intermediate point during fabrication. The metal layer is patterned a second time to remove the high current paths and enable functional operation. This method may be used as a 100% quality assurance test, with reasonable costs and flexibility. The present invention is a three step process for use in the fabrication of a microelectronic device containing conducting elements, each of which have an input contact and an output contact.

This testing process includes the steps of a first metal patterning step which forms the normal conductor paths and adds additional conductive paths to the input contacts and the output contacts of the conducting elements which are to be tested so that the conducting elements themselves may be tested at a higher current density than would otherwise be possible. The second step is to conduct a burn-in or a screen test. The third step is a second metal patterning step which removes the additional conductive paths from the input contacts and the output contacts and which leaves the microelectronic device in its normal functional configuration. The advantage of this testing process is that the reliability of the actual conductive element of interest may be determined during burn-in testing using a higher current density to accelerate the failure of defective components.

It is an object of the present invention to screen out defective microelectronic devices during fabrication.

It is another object of the present invention and perform high current testing of ohmic elements on semiconductors by patterning a metal layer after which the metal layer is patterned a second time to remove the high current paths and enable functional operation.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

Figure 1:
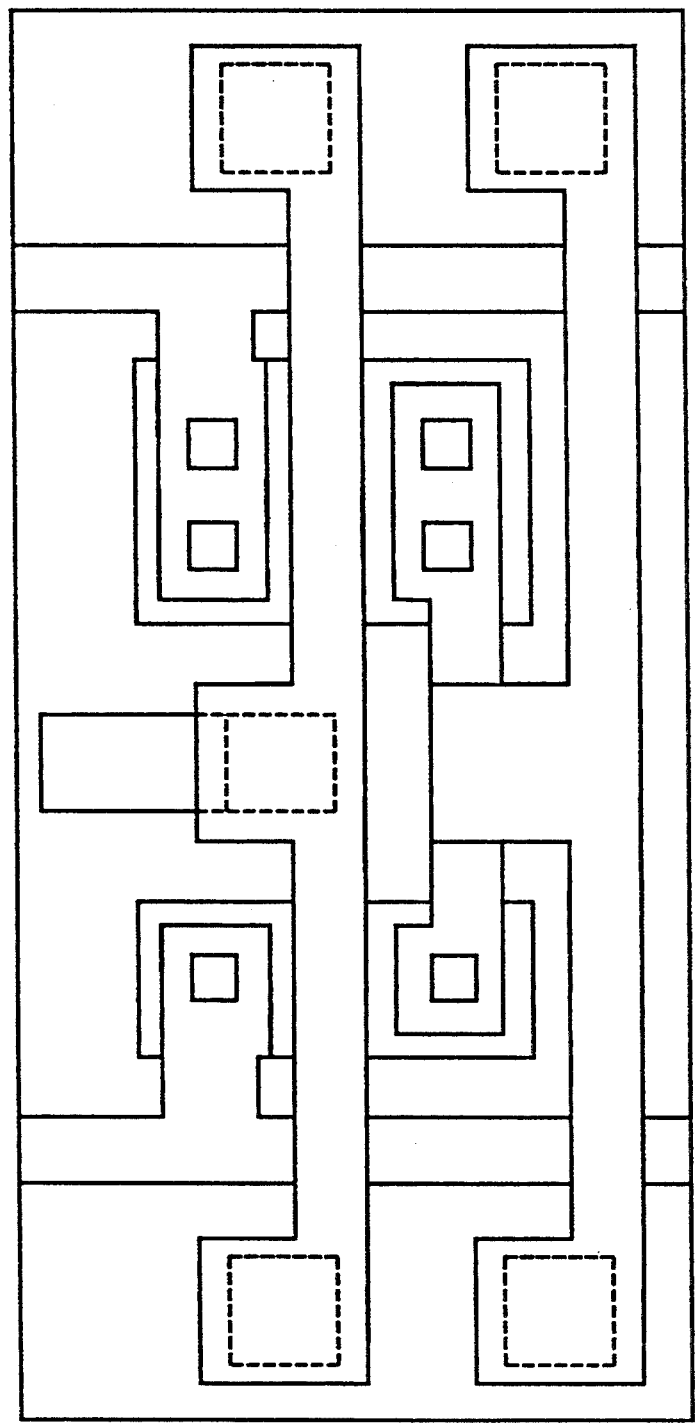
FIG. 1 is an illustration of an electrical inverter circuit to be tested by the present invention.

The present invention is a three-step method for testing or screening metal or polysilicon conductors and contacts on microelectronic devices. The first step is a metal patterning step in which additional metal paths are added to the input and output ends of elements on the microelectronic devices. These additional metal paths enable one to conduct high current testing of the elements of interest (the second step of the method).

The second step of the process is to conduct burn-in or screen testing of the circuit. As mentioned above, this involves operating the circuit at higher temperatures, voltages, current densities or frequencies of operation than in normal use.

The third step of the process is a second metal patterning step, in which the additional metal paths are removed, and the microelectric device is returned to its normal configuration for use. The advantage of this testing process is that the reliability of the actual conductive element of interest may be determined during burn-in testing in a short time at high current density. The first and third metal patterning steps are (in themselves) known in the art and described in texts such as "Metal—Semiconductor Contacts" by E. H. Rhoderick, the disclosure of which is incorporated herein by reference.

Defective devices once incorporated into equipment are very hard to find and expensive to replace, particularly if the equipment is in field use. Accordingly, there is considerable interest in methods to screen devices having defective oxides prior to their incorporation into equipment.

The most common method for screening a device is burn-in. This typically involves operating a device at a higher than normal voltage level for a prescribed period of time, sometimes at elevated temperatures. Oxide failures tend to be greatly accelerated by higher voltages, and to a lesser extent by higher temperatures.

However, it is important that the applied voltage be less than the gate punch-through voltage, which is apt to be only slightly larger than the maximum power supply voltage in state-of-the-art devices. This imposes limits on the magnitude of the power supply voltage that can be safely employed without introducing hot electron problems or causing transistor shorts.

As described above, the present invention is compatible with normal device processing. The current flow during screening or testing can be many orders of magnitude larger than the normal operating currents. The means used to enable screening are subsequently removed from the part after use, so that they do not themselves affect the reliability or functional operation of the part. These means do add area and layout restrictions, which must be evaluated in terms of cost and benefit by the manufacturer and the customer.

At this writing, the stressing and/or testing enabled by this means is intended to overcome the problems associated with traditional burn-in testing. Even so, it may not be possible to supply enough current to every stripe in a device with a large number of stripes to cause all unreliable stripes to fuse open if they contain a defect. But it may be possible to do this on parts with a few logic gates. Also, it may not be possible to detect '1/f' current noise associated with a defect if the current density must be very large and there are a large number of logic gates. But it may be possible if the required current is low and the number of gates is small. However, it may be possible to modify the envisioned embodiment slightly to enable screening in devices containing large numbers of gates, for example, by using a more complex pre-patterning mask, more test terminals, longer test times, and higher or lower test temperatures. All of these improvements are within the scope of the invention.

The basic idea embodied in the invention will be described in the form envisioned for application to an inverter made with the poly-silicon gate CMOS device technology. Similar applications may be made to other logic gates, and to other device technologies. The transistors in a logic gate are provided with a number of features which together enable high currents to flow in all the stripes and contacts which will later be active during functional operation of the part. These features will be explained with the aid of FIG. 1, which shows the design layout of a normal inverter, and FIG. 2, which shows the design layout of an inverter with one possible embodiment of the invention.

Figure 2:
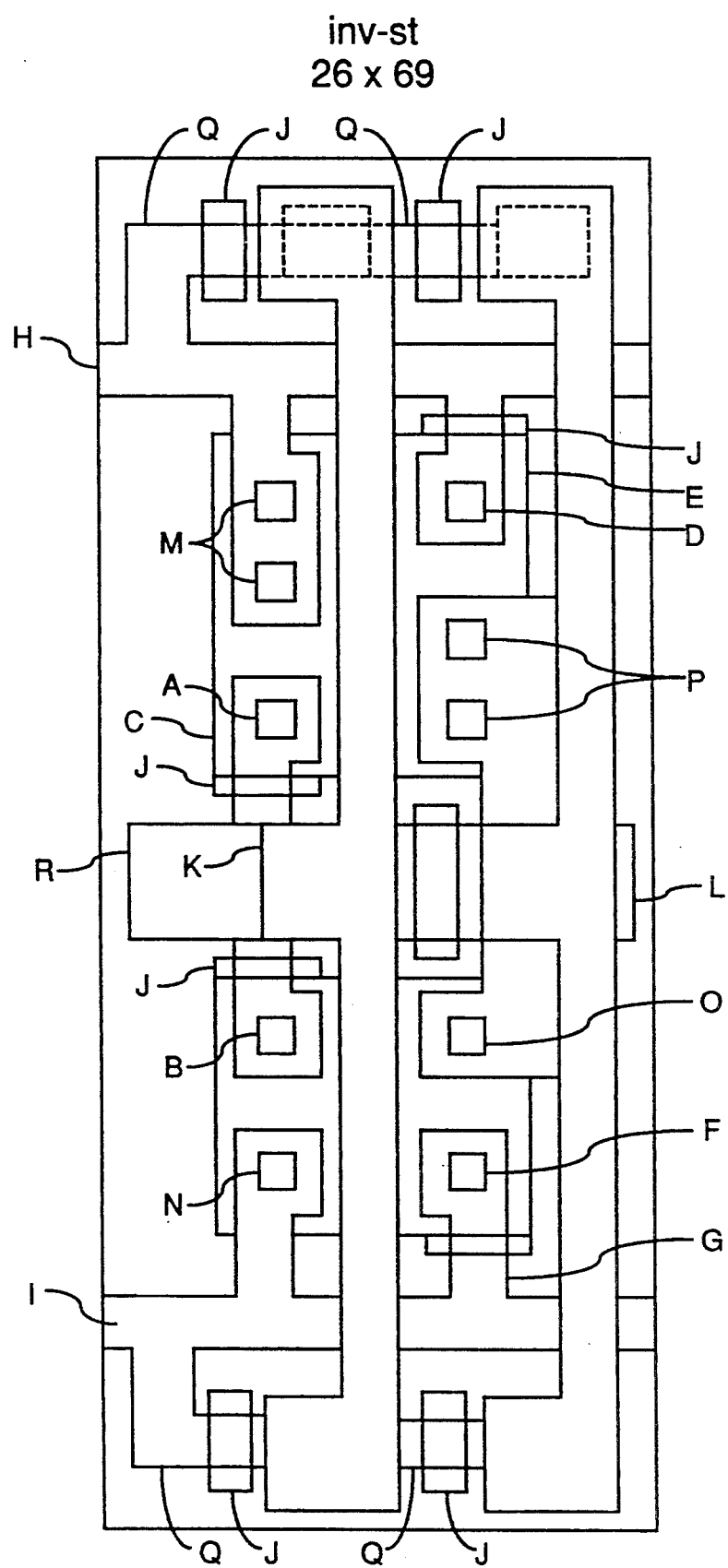
FIG. 2 is an illustration of the electrical inverter circuit of FIG. 1 after being modified by the metal patterning step of the invention that adds metal contacts to enable high current density testing.

Referring to FIG. 2, the novel features of the invention and their purpose will be described. Extra source contacts (A and B) and an extra metal line (C) connected between them are used to provide a low resistance path for current flow through the normal power supply lines (H and I) and source contacts (M and N). Using typical process parameters, it is estimated that the impedance of this path would be about 100 ohms. Likewise, extra drain contact (D and F) and metal lines (E and G) are used to provide a low resistance current path through the normal drain contacts (0 and P) and the metal line connecting them. To screen test the part at this point in fabrication, a voltage source should be connected across the normal power supply lines (H and I). Current will flow through the lines and contacts which make up the functional gate, by virtue of the extra contacts and lines added in the modified structure. During this current flow severe defects may heat and melt or vaporize, or electromigrate and cause opens. These might be detected during testing, or more likely, detected during subsequent functional tests of the part after full processing. Also 1/f noise measurement tests could be done to detect the presence of other defects, or to characterize the film and contacts. This might involve supplying a constant current to the sample and measuring noise current due to fluctuations in the device. This may involve test measurements at various frequencies, and possibly at different temperatures. Since sample connection problems may interfere with 1/f noise measurements, on chip or in kerf test circuitry might be useful to supply and measure test currents or voltages, and this variation is also considered within the scope of this invention.

It would also be desirable to stress the poly-silicon gate and output conductors used in this particular design layout to carry connections through the cell to allow contact on either top or bottom. This is accomplished by adding extra metal lines (Q) connecting both ends of the poly lines to the nearest supply lines. Simply running current through the poly lines could be done by connecting a voltage across the supply lines. But this would not stress the normal contacts (K and L) which connect the poly lines to the input and output nodes of the gate. Also, the length of the poly results in high resistance, an estimated 430 ohms for typical process parameters. Both of these problems can be remedied somewhat by adding an extra metal stripe (R) which connects the input node to the output node, and which also connects to the normal contacts (K and L) to the ploy lines to be tested. This configuration allows the center metal line (R) to be used as one terminal of the stressing voltage source, and the two normal supply lines (H and I) to be used as the other terminal, possibly even tied together. The preferred biasing arrangement might be (H) positive with respect to (R), and (I) negative with respect to (R) in order to avoid forward biasing well or substrate parasitic junctions. In this way, current can flow from the two normal supply lines (H and I) through the normal contacts (K and L). The length of each poly path is reduced by about half, resulting in an impedance of about 215 ohms. Note also that the impedance of the source and drain current paths described above is also halved (to about 50 ohms), since now current can flow from the normal supply lines (H and I) and to the center metal (R).

After screening, the inverter is finally configured into its desired functional form by simply completing metal patterning by removing extra metal links at several locations (J). If the overcoat passivation has not been applied, this may be accomplished by another mask and etch step. If the overcoat passivation has been applied, then openings may be masked and etched in the passivation to allow access to the metal to be removed, followed by a metal removal step, effectively using the oxide as an etch pattern for the metal. If further processing has been done, for example, passivation and second or third metal level deposition, this patterning and metal removal may still be possible, but may require design rules to disallow certain layers over the access points, or otherwise preserve access to the areas of metal which must be removed.

Also, it may be possible to configure essentially equivalent testing means by using other film layers (e.g. second or later metal), accessing contacts, metal lines, vias, poly lines, etc. to be screened by using vias, or openings in the underlying insulator layers. It may also be possible to screen layer by layer. Another possible implementation would be to use extra conductor lines with known fusing characteristics which might act as a stress limiting means. All of these variations are considered to be within the scope of this invention, since the novelty of testing as deposited films and contacts which will make up a finished product with specially configured sacrificial conductor patterns is preserved.

Referring to FIG. 2, the inverter shown would be configured into its normal functional form by removing metal links (J). The left and right sides of metal line (R) may or may not connect to other gate inputs or outputs, depending on design layout, so patterning and isolation at these edges may or may not be necessary after screening. During screening, many lines (R) in many gates may be connected together. If access to these links was by openings in an overlying passivation, these openings might be closed by deposition of some material, or they could be left open and guardbanded by diffusions around them to prevent spreading of contaminants which might enter. The extra source and drain contacts, and unremoved parts of the added metal lines may simply be left in place. Some may add slight node capacitance to the underlying well, or overlying elements, but they do not interfere with the normal functional operation of the finished part.

It is of interest to calculate the current densities which can be achieved in the contacts and metal lines during screening, to determine the achievable acceleration factors for aging defects and to determine whether meaningful 1/f noise measurements can be done. This also must be done in order to determine requirements for designing the power line bus layouts, which may also be patterned initially in a configuration which enables screening but is modified for final functional operation. It is possible that elements may have to be added by design to the power bus line mask in order to control screening currents.

Figure 3:
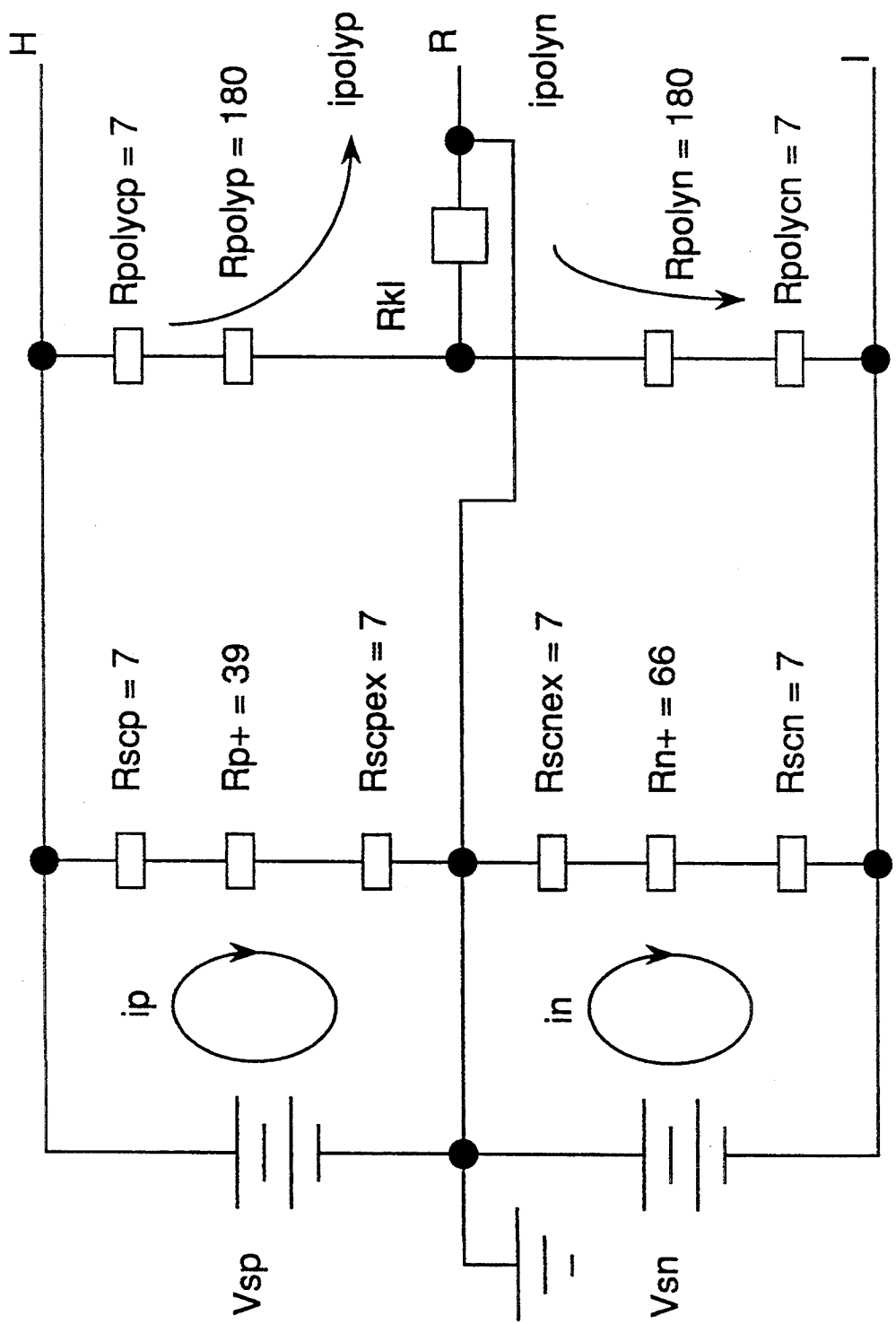
FIG. 3 is an illustration of the test strategy used to perform burn-in testing.

As noted above, the source and drain paths may have impedances of about 50 ohms, and the poly paths may have impedances of about 215 ohms. In other geometries, technologies, and gates, the impedances might be different. The maximum current densities which could be achieved in a single gate can be estimated by referring to FIG. 3. We assume here that drain to substrate avalanche voltage in either the n or p channel limits the voltage which can be connected across the stress terminals. In the latter case described above, this connection would be between the power supply lines (H and I) and the center metal conductor (R). Avalanche voltage may be about 25 volts. It may actually be higher or lower, but in any case, it seems unlikely that voltages approaching such numbers would actually be needed in practice. A stress voltage of 10 volts is used in the calculations below, as shown in FIG. 3 and Table 1 below.

A resistance of 7 ohms is used for a minimum sized metal to silicon contact, and 13 ohms per square for the P+ source diffusion resistance, and 22 ohms per square resistance for the N+ source diffusion. The number of squares of source diffusion in the paths shown is about three. The metal line resistances are much smaller because of the low aluminum resistance, which may be 0.04 ohms per square. The current through the P channel source metal path would be about $$10 \text{ volt}/(7+3*13+7 \text{ ohms}) = 10/53 \text{ A} = 0.189 \text{ A} = 189 \text{ mA}. \quad \text{(Eq. 1)}$$

The crossectional area of the metal lines being stressed may be $$3 \text{ um} \times 1 \text{ um} = 3 \text{ sq um} \times (1e4 \text{ sq cm}/1e12 \text{ sq um}) = 3e\text{-}8 \text{ sq cm}. \quad \text{(Eq. 2)}$$

This corresponds to a line current density of about $$189 \text{ mA}/3 \text{ sq um} = 63 \text{ mA/sq um} \quad \text{(Eq. 3)}$$

$$\text{or } 63 \text{ mA/sq um} \times (1 \text{ A}/1e3 \text{ mA}) \times (1e12 \text{ sq um}/1e4 \text{ sq cm}) = 6.3e6 \text{ A/sq cm}. \quad \text{(Eq. 4)}$$

This is well within the range of current densitites used for electromigration life tests, which may be about 1e6 to 2e6 A/sq cm. It is also well above that reported for 1/f noise measurements, which may be about 2e6 A/sq cm. It also approaches the current densities used in fast wafer level metal screens done on test structures as wafer qualification tests, such as the SWEAT or BEM tests, which may use current densities in the range of 6e6 to 10e6 A/sq cm.

The current through the n channel source contact and line path would be about $$10 \text{ volt}/(7+3*22+7 \text{ ohms}) = 10/80 \text{ A} = 0.125 \text{ mA} = 125 \text{ mA}. \quad \text{(Eq. 5)}$$

The current density would be about 4.2e6 A/sq cm, also well within the screening and accelerated test ranges. With slightly higher voltages, currents in the range of BEM and SWAT tests might be achievable.

From equation 1, current density in a minimum sized contact in the p channel path may be about $$189/(2 \text{ um} \times 2 \text{ um}) = 47.3 \text{ MA/sq um} = 4.7e6 \text{ A/sq cm}. \quad \text{(Eq. 6)}$$

This approaches the range of current densities used for contact electromigration accelerated life tests, which may be 8e6 to 2e7 a/sq cm. The n channel path contact current density would be lower, about 3.1e6 A/sq cm, and again, both could be raised somewhat by using higher voltages.

The poly path resistances may all be similar, and assuming a 7 ohm contact resistance and a 18 ohm per square resistance, the current at 10 v may be about $$10 \text{ volts}/(7+10*18+7 \text{ ohms}) = 0.052 \text{ A} = 52 \text{ mA} \quad \text{(Eq. 7)}$$

For a 3 um × 1 um cross section, this corresponds to a current density of $$52 \text{ mA}/(3\text{um} \times 3\text{um}) = 8.7 \text{ mA/sq um or about } 0.87e5 \text{ A/sq cm}. \quad \text{(Eq. 8)}$$

Note that the contacts to line R in FIG. 2 carry current from both the top and the bottom half poly paths in opposite directions for the biasing shown. It may be desirable to add a redundant contact to each of (K) and (L) and split the poly runs and join the two contacts with metal. This would add area, but ensure stressing the poly contacts.

It is not known what current densities are required to fuse defects which leave only small poly areas connected, or whether it is even desirable to screen the poly runs at all. It is noted that silicided poly may have much lower resistances, on the order of 2 to 4 ohms per square, and this would result in much higher possible screening currents. If current densities in silicided poly are too high, current might be lowered by adding resistance to these paths by various means.

This invention would be useful for preparing test samples which bear a close resemblance to finished products, for use as test samples in experiments, regardless of whether screening is done on every device. This may be helpful in studying layout factors which may influence reliability which may not be seen in simpler test structures.

It is noted that with fixed design rules, the modified inverter is slightly larger and may have higher drive and hence speed capabilities. It is of interest to calculate the expected size penalty associated with using this invention because this probably is the dominant cost factor, although decreased yield due to added processing, and test time would also contribute. It would be useful to be able to calculate the cost to benefit ratio to the customer for using the present invention. This would require knowing the proportion of defectives not caught by functional testing, and not accelerated to failure by burn-in, and which would fail during useful life, and which would be caught with this new test method.

It is interesting to note that this test might be done at the wafer level to initiate some failures before packaging and burn-in, so that the failures are detected at lower cost. The calculation of cost/benefit ratio also requires knowledge of the cost of later repairs. Some of these costs are unknown and difficult to estimate. However, if device area is small, or if field failures are dangerous or costly to repair, there may be economic, as well as quality, motivations for using this invention.

To determine the area penalty associated with the invention, the layouts in FIGS. 1 and 2 have been measured. The size of the inverter in FIG. 1 is 25×54 units, and the size of the one in FIG. 2 is 26×69 units. The layout in FIG. 2 is larger by a factor of 26/25 or about 1.04 in one direction and by 69/54 or about 1.3 in the other direction. The total area is larger by (26×69)/(25×54) or by a factor of about 1.3. It is noted that this growth is probably worst case for the inverter shown, and that another layout of a eight transistor NOR-INVERTER circuit had about a 1.14 area growth.

It is also useful to get some idea of whether supply line design will be a problem. If more than one gate is to be stressed through the same supply lines, the supply line current density will scale up for a fixed size. This may dictate much larger power lines than would be needed for normal operation. This might be handled in more than the one way. For example, one approach might be to use lower current densities for longer times. Another might be to use very large lines, possibly routed on a different conductor layer, or on the top surface of the device. Still another approach might be to connect the gates in groups to the stressing supply, either in sequence, or possibly simultaneously using multiple stressing supplies. These and other possible arrangements which might be constructed by those skilled in the art of microcircuit design are considered to be within the scope of the present invention. Also, the test times might be short enough that damage is not significant at the high current densities. Also tests might be developed which are effective at lower current densities.

The details of the tests done using equipment external to the device may vary, and are not considered to be within the scope of the present invention. However, a feature which is considered to be within the scope is any added circuitry on the device, or on the wafer, which applies screening or testing currents to layouts modified according to the example described here, regardless of the specific tests implemented, since it is conceivable that such a feature might be critical in implementing a practical screening method.

It is possible that other embodiments of this invention could be implemented in poly gate CMOS technologies, or in other fabrication technologies.

TABLE 1

FIG. 3 Equations $$ip = \frac{Vsp}{(Rscp + Rp + Rscnex)}$$

$$in = \frac{Vsn}{(Rscn + Rn + Rscnex)}$$

$$iployp = \frac{Vsp}{(Rpolycp + Ppolyp + Rkl)}$$

$$ipolyn = \frac{Vsp}{(Rpolycn + Rpolyn + Rkl)}$$

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A testing process for use in fabrication of a microelectronic device containing conducting elements, each of which have an input contact and an output contact, a testing process comprising the steps of:
   a first metal patterning step which forms normal conductors and contacts of the microelectronic device and adds additional conductors and contacts that form added paths which allow higher than normal current flow through the conductors and contacts which are to be tested than would be possible without the additional conductors wherein said microelectronic device is a transistor with a source terminal, a gate terminal, and a drain terminal, and wherein said first metal patterning step comprises adding additional conductors and contacts to establish a conductive path enabling testing of contacts and interconnects of the source terminal;
   a burn-in and screen testing step in which high current testing is performed on the conductors and contacts; and a second metal patterning step which removes the additional conductor paths and leaves the microelectronic device in its normal functional configuration.

2. A testing process, as defined in claim 1, wherein the high current testing performed during the burn-in and screen testing step comprises an application of a voltage difference across the conductive paths established in the metal patterning step, wherein said voltage difference has a predetermined value which results in a higher current density in the conductors and contacts to be tested than a normal operating current density.

3. A testing process for use in fabrication of a microelectronic device containing conducting elements, each of which have an input contact and an output contact, a testing process comprising the steps of:
   a first metal patterning step which forms normal conductors and contacts of the microelectronic device and adds additional conductors and contacts that form added paths which allow higher than normal current flow through the conductors and contacts which are to be tested than would be possible without the additional conductors wherein said microelectronic device is a transistor with a source terminal, a gate terminal, and a drain terminal, and wherein said first metal patterning step comprises adding additional conductors and contacts to establish a conductive path enabling testing of contacts and interconnects of the drain terminal;
   a burn-in and screen testing step in which high current testing is performed on the conductors and contacts; and a second metal patterning step which removes the additional conductor paths and leaves the microelectronic device in its normal functional configuration.

4. A testing process, as defined in claim 3, wherein the high current testing performed during the burn-in and screen testing step comprises an application of a voltage difference across the conductive paths established in the metal patterning step, wherein said voltage difference has a predetermined value which results in a higher current density in the conductors and contacts to be tested than a normal operating current density.

5. A testing process for use in fabrication of a microelectronic device containing conducting elements, each of which have an input contact and an output contact, a testing process comprising the steps of:
   a first metal patterning step which forms normal conductors and contacts of the microelectronic device and adds additional conductors and contacts that form added paths which allow higher than normal current flow through the conductors and contacts which are to be tested than would be possible without the additional conductors wherein said microelectronic device is a transistor with a source terminal, a gate terminal, and a drain terminal, and wherein said first metal patterning step comprises adding additional conductors and contacts to establish a conductive path enabling testing of contacts and interconnects of the gate terminal;
   a burn-in and screen testing step in which high current testing is performed on the conductors and contacts; and a second metal patterning step which removes the additional conductor paths and leaves the microelectronic device in its normal functional configuration.

6. A testing process, as defined in claim 5, wherein the high current testing performed during the burn-in and screen testing step comprises an application of a voltage difference across the conductive paths established in the metal patterning step, wherein said voltage difference has a predetermined value which results in a higher current density in the conductors and contacts to be tested than a normal operating current density.

7. A testing process for use in fabrication of a microelectronic device containing conducting elements, each of which have an input contact and an output contact, a testing process comprising the steps of:

a first metal patterning step which forms normal conductors and contacts of the microelectronic device and adds additional conductors and contacts that form added paths which allow higher than normal current flow through the conductors and contacts which are to be tested than would be possible without the additional conductors wherein said microelectronic device is a power supply bus conductor path with a signal interconnect conductor path, and wherein said first metal patterning step comprises adding additional conductors and contacts to establish a conductive path enabling their testing;

a burn-in and screen testing step in which high current testing is performed on the conductors and contacts; and a second metal patterning step which removes the additional conductor paths and leaves the microelectronic device in its normal functional configuration.

8. A testing process, as defined in claim 7, wherein the high current testing performed during the burn-in and screen testing step comprises an application of a voltage difference across the conductive paths established in the metal patterning step, wherein said voltage difference has a predetermined value which results in a higher current density in the conductors and contacts to be tested than a normal operating current density.

* * * * *